United States Patent
Tang et al.

(10) Patent No.: US 8,225,017 B1
(45) Date of Patent: Jul. 17, 2012

(54) METHOD AND APPARATUS FOR REDUCING POWER SUPPLY INTRODUCED DATA DEPENDENT JITTER IN HIGH-SPEED SERDES TRANSMITTERS

(75) Inventors: Haiming Tang, Sunnyvale, CA (US); Yu-Tang Hsieh, Mountain View, CA (US)

(73) Assignee: Marvell International Ltd., Hamilton (BM)

( * ) Notice: Subject to any disclaimer, the term of this patent is extended or adjusted under 35 U.S.C. 154(b) by 426 days.

(21) Appl. No.: 12/251,367

(22) Filed: Oct. 14, 2008

Related U.S. Application Data

(60) Provisional application No. 60/980,603, filed on Oct. 17, 2007.

(51) Int. Cl.
*G06F 13/38* (2006.01)
*H04J 3/02* (2006.01)

(52) U.S. Cl. .................................... 710/71; 370/537

(58) Field of Classification Search ............... 710/71
See application file for complete search history.

(56) References Cited

U.S. PATENT DOCUMENTS

| | | | | |
|---|---|---|---|---|
| 5,931,927 A * | 8/1999 | Takashima | ...... | 710/65 |
| 7,026,848 B2 * | 4/2006 | Wang et al. | ...... | 327/112 |
| 7,308,060 B1 * | 12/2007 | Wall et al. | ...... | 375/355 |
| 2005/0024243 A1 * | 2/2005 | Kim | ...... | 341/101 |
| 2007/0088998 A1 * | 4/2007 | Bonneau et al. | ...... | 714/724 |

\* cited by examiner

*Primary Examiner* — Henry Tsai
*Assistant Examiner* — Titus Wong

(57) ABSTRACT

A high-speed SerDes transmitter which may reduce power supply introduced data dependent jitter. Instead of trying to make the output voltage of a power supply of a pre-driver constant, the output voltage of the power supply is returned to its normal level periodically, e.g., after each bit time to follow the data rate of an input data stream. A complementary pre-driver may be used to create a complementary data stream which may be at the same data rate as the input data rate. The complementary data stream may have a transition when there is no transition between two consecutive bits in the input data stream, but have no transition when there is a transition in the input data stream. As a result, there is a transition at the power supply during each bit time, and the power supply may be drawn back to its normal level during each bit time. Consequently, the power supply variation is periodic at the beat of the input data rate, and the power supply may have the same impact on each data bit. Thus, each bit in the input data stream may see the same level of power supply, and data dependent jitter may be reduced or eliminated.

27 Claims, 4 Drawing Sheets

METHOD AND APPARATUS FOR REDUCING POWER SUPPLY INTRODUCED DATA DEPENDENT JITTER IN HIGH-SPEED SERDES TRANSMITTERS

CROSS REFERENCE TO RELATED APPLICATION

This application claims the benefit of priority to previously filed U.S. provisional patent application Ser. No. 60/980,603, filed Oct. 17, 2007, entitled A METHOD TO ELIMINATE POWER SUPPLY INTRODUCED DATA DEPENDENT JITTER IN HIGH-SPEED SERDES TRANSMITTER. That provisional application is hereby incorporated by reference in its entirety.

BACKGROUND

1. Field of the Invention

The present invention relates generally to data transmission, and more particularly to reducing jitter introduced by power supplies.

2. Description of Related Art

A SerDes, or Serializer/deserializer converts a parallel data stream to a serial data stream and vice versa. SerDes chips facilitate the transmission of parallel data between two points in high-speed serial streams over a differential media, reducing the number of signal paths and thus the number of connecting pins or wires required. SerDes devices may be used in wireless network routers, fiber optic communications systems, USB interfaces, PCIE (Peripheral Component Interconnect Express), and storage applications, and are capable of operating at speeds in excess of 10 Gbps.

Transmission jitter can include a random jitter component and a deterministic jitter component. Predicting causes of random jitter can be difficult. Deterministic jitter may result from conditions such as Duty Cycle Distortion (DCD), Data Dependent Jitter (DDJ), and Periodic Jitter.

DDJ, sometimes called Inter-symbol Interference (ISI), is usually the result of a bandwidth limitation problem in either a transmitter or physical media over which transmission is occurring. Reduction in transmitter or media bandwidth may result in varying amplitudes of data bits and changes in the time domain. Jitter depends not only on repeating-bit lengths, but also on states of preceding bits, so that jitter is correlated with the sequence of bits in a data stream.

FIG. 1 illustrates a currently available high-speed serial data transmitter which converts a parallel data input into a serial data output. As shown, an N to 2 multiplexer (MUX) 101 may convert N parallel input data streams into 2 parallel data streams: $D_{odd}$ consisting of the odd numbered bits of a serial data stream D and $D_{even}$ consisting of the even numbered bits of the serial data stream D. At the final stage of multiplexing the parallel data streams into the serial data stream D, a 2 to 1 MUX 102 may receive $D_{odd}$ and $D_{even}$ and combine them into the serial data stream D. A low jitter clock 103 may be used to retime the serial data stream D and to clean up the data, thus avoiding DDJ at the output of the 2 to 1 MUX 102. The low jitter clock 103 may be, e.g. a Phase Locked Loop (PLL). The clean data may then go to a pre-driver 104 before reaching a final transmitter driver 106. At this point, DDJ may start to accumulate due to limited bandwidth and non-ideal power supply.

Currently, inverter based pre-drivers are widely used in high-speed low power data communications. The pre-driver 104 may be coupled to a power supply 105, as shown in FIG. 1. The voltage output of the power supply 105 may fluctuate even when a dedicated regulated power supply is used. Not only is it difficult to keep the pre-driver power supply 105 constant over time, but also the fluctuation is often not able to settle before the next data bit arrives in high-speed data transmissions. The residue of a preceding data bit interferes with a next data bit or later bits through the power supply 105, introducing data dependent jitter (DDJ). The DDJ introduced by the power supply 105 is a primary jitter source in currently available high-speed low power transmitters.

One conventional way to reduce the DDJ introduced by the power supply 105 is to add decoupling capacitors to the power supply 105, in order to reduce the fluctuation in the power supply 105. However, adding decoupling capacitors to low impedance nodes may take a lot of space and is not efficient. Meanwhile, it may increase the settling time for the power supply 105 before the next bit arrives. The other extreme is to remove all decoupling capacitors on the power supply 105 to minimize the settling time, but in high speed applications, the power supply 105 still cannot settle within a bit time.

With careful design, data transitions may become fast enough so that the rise/fall of the current bit data does not depend on preceding bit states, and the major source of DDJ may be from the power supply. Therefore, it may be desirable to provide a method and apparatus which may reduce power supply introduced data dependent jitter in high-speed SerDes transmitters.

BRIEF DESCRIPTION OF THE DRAWING FIGURES

Embodiments of the present invention are described herein with reference to the accompanying drawings, similar reference numbers being used to indicate functionally similar elements.

DETAILED DESCRIPTION

The present invention provides a high-speed SerDes transmitter which may reduce power supply introduced data dependent jitter. The accuracy of a power supply of a pre-driver may vary depending on the pattern of an input data stream. Instead of providing a constant voltage output, the output voltage of the power supply may gradually go up when there are consecutive 0s in a data stream, and may gradually go down when there are consecutive 1s in a data stream.

Instead of trying to make the output voltage of a power supply of a pre-driver constant, the present invention tries to make the output voltage of the power supply return to its normal level periodically, e.g., after each bit time, to follow the data rate of an input data stream. A complementary pre-driver may be used to create a complementary data stream which may be at the same data rate as the input data rate. The complementary data stream may have a transition when there is no transition between two consecutive bits in the input data stream, but have no transition when there is a transition in the input data stream. As a result, there is a transition at the power supply during each bit time, and the power supply may be drawn back to its normal level during each bit time.

Consequently, the power supply variation is periodic at the beat of the input data rate, and the power supply may have the same impact on each data bit. Thus, each bit in the input data stream may see the same level of power supply, and the data dependent jitter may be reduced or eliminated.

Figure 1:
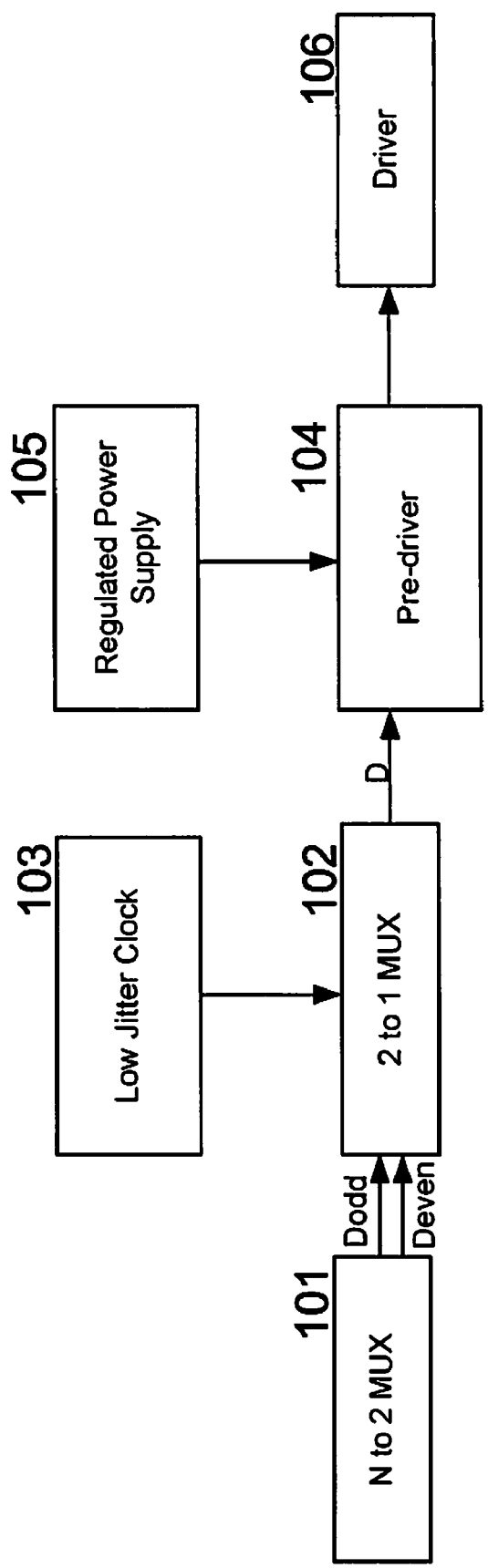
FIG. 1 illustrates a currently available high-speed serial data transmitter which converts a parallel data input into a serial data output.
Figure 2:
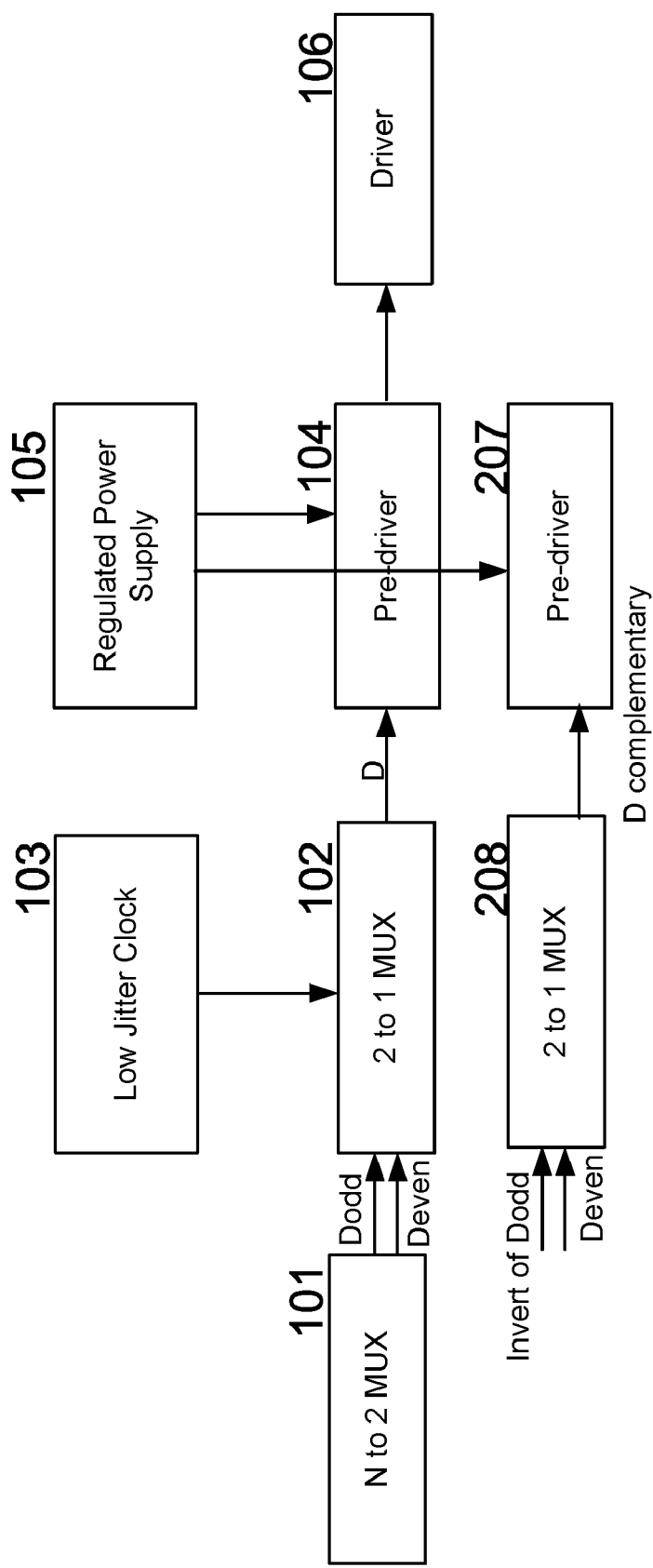
FIG. 2 illustrates a high-speed serial data transmitter according to one embodiment of the present invention.

FIG. 2 illustrates a high-speed transmitter according to one embodiment of the present invention. As shown, a complementary data stream may be added to the power supply 105. The complementary data stream may add a transition to the power supply 105 when the input data stream D of the pre-driver 104 does not have a transition between two consecutive bits, but may add nothing when the input data stream D has a transition between two consecutive bits. The transition may be a rise or a fall. The complementary data stream may be created by a complementary pre-driver 207 coupled to the power supply 105. The complementary pre-driver 207 may be coupled to a complementary 2 to 1 multiplexer 208.

Figure 3A:
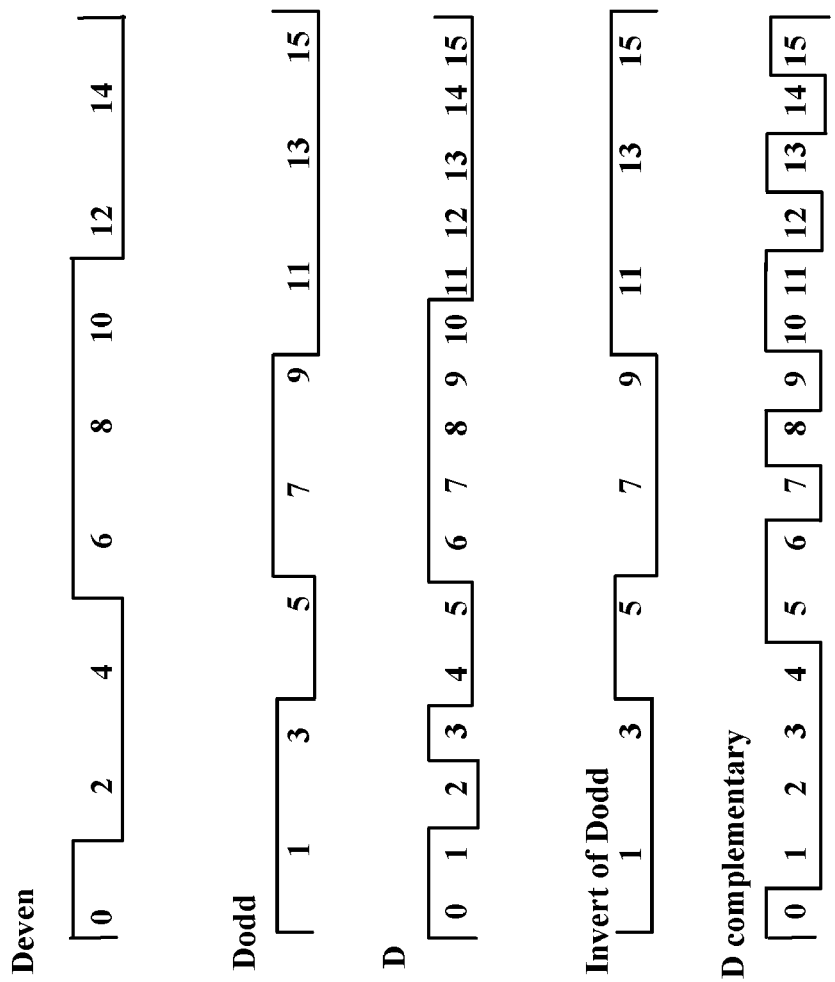
FIG. 3A illustrates waveforms obtained during the operation of a high-speed serial data transmitter according to one embodiment of the present invention.

In one embodiment, the input of the complementary 2 to 1 multiplexer 208 may be $D_{even}$ and the inverse of $D_{odd}$. FIG. 3A illustrates waveforms of signals in this example. As shown, a sub-stream $D_{even}$ at one input of the 2 to 1 multiplexer 102 may be, for example:

0 1 1 1 0 0 at bits 0, 2, 4, 6, 8, 10, 12, and 14.

A sub-stream $D_{odd}$ at the other input of the 2 to 1 multiplexer 102 may be, for example:

1 1 0 1 1 0 0 0 at bits 1, 3, 5, 7, 9, 11, 13, and 15.

Consequently, the output of the 2 to 1 multiplexer 102 may be, e.g., 1 1 0 1 0 0 1 1 1 1 1 0 0 0 0 0 at bits 0-15.

The inverse of $D_{odd}$ at one input of the complementary 2 to 1 multiplexer 208 may be, for example:

0 0 1 0 0 1 1 1 at bits 1, 3, 5, 7, 9, 11, 13, and 15.

The complementary 2 to 1 multiplexer 208 may multiplex the sub-stream $D_{even}$ and the inverse of the sub-stream $D_{odd}$, and its output may be, for example:

1 0 0 0 0 1 1 0 1 0 1 1 0 1 0 1 at bits 0-15.

Thus, the complementary 2 to 1 multiplexer 208 may create a transition at the power supply 105 when there is no transition between two consecutive bits in the data stream D. For example, there is no transition from bit 0 to bit 1 in the data stream D, but the complementary 2 to 1 multiplexer 208 creates a transition from bit 0 to 1 in a data stream $D_{complementary}$; and there is no transition from bit 4 to 5 in the data stream D, but the complementary 2 to 1 multiplexer 208 creates a transition from bit 4 to 5 in the data stream $D_{complementary}$. Similarly, transitions are also created from bit 6 to 7, from bit 7 to 8, from bit 8 to 9, from bit 9 to 10, from bit 11 to 12, from bit 12 to 13, from bit 13 to 14, and from bit 14 to 15 in the data stream $D_{complementary}$. Thus, the power supply 105 may see a transition during each bit time, and the voltage output of the power supply 105 may be drawn back to its normal level during each bit time. Since the regulated power supply 105 is at the same voltage level at each data transition point, the data dependent jitter may be eliminated or reduced.

Figure 3B:
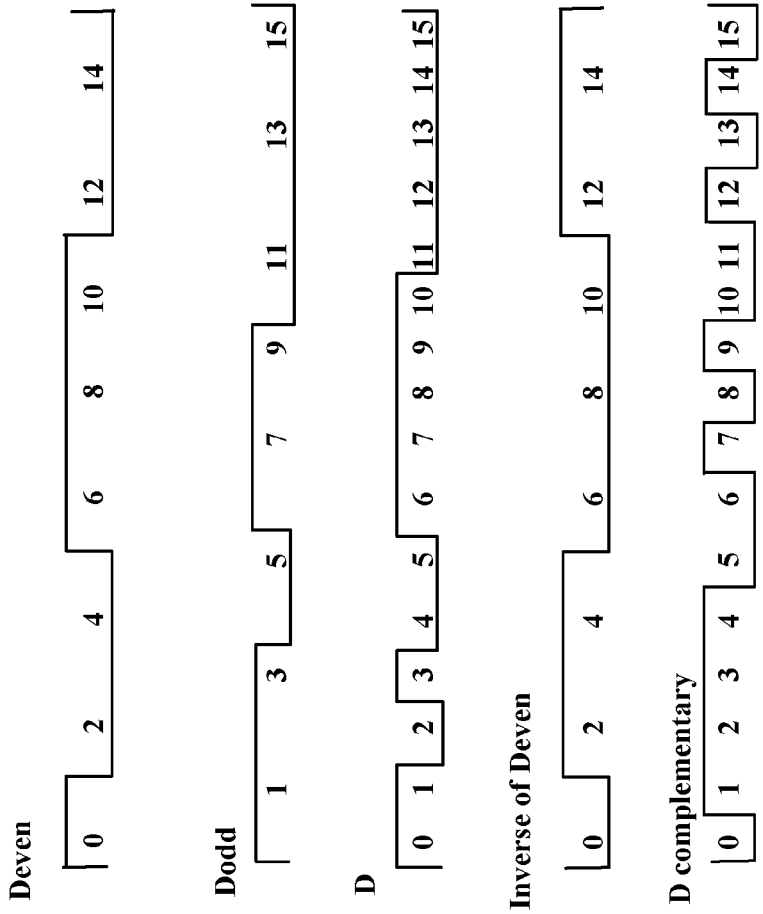
FIG. 3B illustrates waveforms obtained during the operation of a high-speed serial data transmitter according to one embodiment of the present invention

In another embodiment, $D_{odd}$ and the invert of $D_{even}$ may be applied to the input of the complementary 2 to 1 multiplexer 208. FIG. 3B illustrates waveforms of signals in this example. As shown, the inverse of $D_{even}$ may be, for example:

0 1 1 0 0 0 1 1 at bits 0, 2, 4, 6, 8, 10, 12, and 14

The complementary 2 to 1 multiplexer 208 may multiplex the sub-stream $D_{odd}$ and the inverse of the sub-stream $D_{even}$, and its output $D_{complementary}$ may be, for example:

0 1 1 1 1 0 0 1 0 1 0 0 1 0 1 0 at bits 0-15.

Similarly to the embodiment shown in FIG. 3A, the complementary 2 to 1 multiplexer 208 may create a transition at the power supply 105 when there is no transition between two consecutive bits in the data stream D. For example, there is no transition from bit 0 to bit 1 in the data stream D, but the complementary 2 to 1 multiplexer 208 may create a transition from bit 0 to 1 in the data stream $D_{complementary}$; and there is no transition from bit 4 to 5 in the data stream D, but the complementary 2 to 1 multiplexer 208 may create a transition from bit 4 to 5 in the data stream $D_{complementary}$. Similarly, transitions may also be created from bit 6 to 7, from bit 7 to 8, from bit 8 to 9, from bit 9 to 10, from bit 11 to 12, from bit 12 to 13, from bit 13 to 14, and from bit 14 to 15 in the data stream $D_{complementary}$. Thus, the voltage output of the power supply 105 may be drawn back to its normal level during each bit time, and the data dependent jitter may be eliminated or reduced.

Several features and aspects of the present invention have been illustrated and described in detail with reference to particular embodiments by way of example only, and not by way of limitation. Alternative implementations and various modifications to the disclosed embodiments are within the scope and contemplation of the present disclosure. Therefore, it is intended that the invention be considered as limited only by the scope of the appended claims.

What is claimed is:

1. A method comprising: converting a plurality of parallel data streams to a serial data stream; applying the serial data stream to a pre-driver, wherein the pre-driver is powered by a voltage output of a regulated power supply, and wherein an output of the pre-driver is coupled to an input of a driver; and periodically returning the voltage output of the regulated power supply to a predetermined level to reduce data dependent jitter in a serializer/deserializer device of a transmitter, wherein the data dependent jitter is introduced by the regulated power supply, wherein a frequency at which the voltage output is returned to the predetermined level is proportional to a data rate of the serial data stream; wherein: the returning of the voltage output to the predetermined level comprises introducing a transition in a data stream complementary to the serial data stream to transition the regulated power supply between a first state and second state when there is no transition in states between two consecutive bits in the serial data stream; the serial data stream has a first data rate; the data stream complementary to the serial data stream has a second data rate; and the second date rate is equal to the first data rate.

2. The method of claim 1, further comprising converting the plurality of parallel data streams into a first sub-stream and a second sub-stream, wherein:
the first sub-stream includes even bits of the serial data stream; and
the second sub-stream includes odd bits of the serial data stream.

3. The method of claim 2, wherein the regulated power supply is configure to supply power to a complementary pre-driver.

4. The method of claim 3, wherein the complementary pre-driver is configured to receive an output of a complementary 2 to 1 multiplexer.

5. The method of claim 4, further comprising receiving at the complementary 2 to 1 multiplexer the first sub-stream and an inverse of the second sub-stream.

6. The method of claim 4, further comprising receiving at the complementary 2 to 1 multiplexer the second sub-stream and an inverse of the first sub-stream.

7. The method of claim 1, wherein the voltage output of the regulated power supply returns to the predetermined level subsequent to each bit of the serial data stream.

8. A serializer/deserializer device, comprising:
an n to 2 multiplexer configured to convert (i) a plurality of parallel data streams into (ii) a first sub-stream and a second sub-stream;
a 2 to 1 multiplexer configured to convert (i) the first sub-stream and the second sub-stream into (ii) a serial data stream;
a first pre-driver powered by a voltage output of a power supply, wherein the first pre-driver is configured to receive the serial data stream; and
a complementary pre-driver powered by the voltage output of the power supply, wherein the complementary pre-drive is configured to (i) receive at least part of the serial data stream and (ii) periodically return the voltage output of the power supply to a predetermined level to reduce data dependent jitter in the serializer/deserializer device, wherein the data dependent jitter is introduced by the power supply, wherein the complementary pre-driver is separate from the first pre-driver; and wherein:
the complementary pre-driver is configured to return the voltage output to the predetermined level including introducing a transition in a data stream complementary to the serial data stream to transition the power supply between a first state and a second state when there is no transition in states between two consecutive bits in the serial data stream; the serial data stream has a first data rate; the data stream complementary to the serial data stream has a second data rate; and the second date rate is equal to the first data rate.

9. The serializer/deserializer device of claim 8, wherein:
the first sub-stream includes even bits of the serial data stream; and
the second sub-stream includes odd bits of the serial data stream.

10. The serializer/deserializer device of claim 8, further comprising a complementary 2 to 1 multiplexer configured to provide the at least part of the serial data stream to the complementary pre-driver.

11. The serializer/deserializer device of claim 10, wherein the complementary 2 to 1 multiplexer is configured to receive the first sub-stream and an inverse of the second sub-stream.

12. The serializer/deserializer device of claim 10, wherein the complementary 2 to 1 multiplexer is configured to receive the second sub-stream and an inverse of the first sub-stream.

13. The serializer/deserializer device of claim 8, wherein the voltage output of the power supply returns to the predetermined level subsequent to each bit of the serial data stream.

14. A transmitter comprising the serializer/deserializer device of claim 8.

15. A receiver comprising the serializer/deserializer device of claim 8.

16. A transceiver comprising the serializer/deserializer device of claim 8.

17. An interface comprising the serializer/deserializer device of claim 8.

18. A peripheral component interconnect express device comprising the serializer/deserializer device of claim 8.

19. The serializer/deserializer device of claim 8, wherein the complementary pre-driver is configured to periodically return the voltage output of the power supply to the predetermined level at a frequency proportional to a data rate of the serial data stream.

20. The serializer/deserializer device of claim 8, wherein the power supply supplies power to the complementary pre-driver.

21. The serializer/deserializer device of claim 8, wherein:
the power supply is configured to increase the voltage output when the serial data stream has two consecutive bits in a first state; and
the power supply is configured to decrease the voltage output when the serial data stream has two consecutive bits in a second state.

22. The serializer/deserializer device of claim 21 wherein:
the first state is 0; and
the second state is 1.

23. The serializer/deserializer device of claim 20, wherein outputs of the n to 2 multiplexer and the 2 to 1 multiplexer cause the voltage output of the power supply to return to the predetermined level.

24. The serializer/deserializer device of claim 8, wherein the complementary pre-driver is configured to refrain from introducing a transition in states in the data stream complementary to the serial data stream when there is a transition in states between two consecutive bits in the serial data stream.

25. The method of claim 1, wherein:
the pre-driver is a first pre-driver; and
the voltage output of the regulated power supply is periodically returned to the predetermined level via a second pre-driver.

26. The method of claim 25, further comprising:
receiving the plurality of parallel data streams at a first multiplexer;
transferring the serial data stream from the first multiplexer to the first pre-driver;
converting the plurality of parallel data streams into a first sub-stream and a second sub-stream;
receiving the first sub-stream and the second sub-stream at a second multiplexer, wherein the second multiplexer is separate from the first multiplexer; and
receiving output of the second multiplexer at the second pre-driver.

27. The method of claim 1, further comprising:
transitioning data in a data stream complementary to the serial data stream based on the data rate;
receiving the data stream complementary to the serial data stream via a pre-driver powered by the regulated power supply; and
based on the data stream complementary to the serial data stream, drawing power from the regulated power supply via the pre-driver to periodically return the voltage output of the regulated power supply to the predetermined level.

* * * * *